(12) United States Patent
Gelissen et al.

(10) Patent No.: US 7,737,873 B2
(45) Date of Patent: Jun. 15, 2010

(54) FLASH A/D CONVERTER

(75) Inventors: Ben Gelissen, Nijmegen (NL); Hendrik Van Der Ploeg, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/909,449

(22) PCT Filed: Mar. 20, 2006

(86) PCT No.: PCT/IB2006/050852

§ 371 (c)(1),
(2), (4) Date: Apr. 14, 2009

(87) PCT Pub. No.: WO2006/100634

PCT Pub. Date: Sep. 28, 2006

(65) Prior Publication Data

US 2009/0201189 A1    Aug. 13, 2009

(30) Foreign Application Priority Data

Mar. 24, 2005 (EP) .................................. 05102404

(51) Int. Cl.
*H03M 1/12* (2006.01)
(52) U.S. Cl. .................. 341/156; 341/154; 341/155
(58) Field of Classification Search ................ 341/155, 341/154, 141, 146, 156
See application file for complete search history.

(56) References Cited

U.S. PATENT DOCUMENTS

| 7,417,572 B1 * | 8/2008 | Williams et al. ............ 341/136 |
| 7,605,740 B2 * | 10/2009 | Pelgrom et al. ............. 341/159 |
| 2004/0119626 A1 | 6/2004 | Lien |

OTHER PUBLICATIONS

Van Der Ploeg, H; et al "A 2.5-V 12-B 54-MSample/S 0.25-MUM CMOS ADC in 1-MM2 With Mixed-Signal Chopping and Calibration" IEEE Journal of Solid-State Circuits, IEEE Inc. New York, US vol. 36, No. 12, Dec. 2001. pp. 1859-1867.

* cited by examiner

*Primary Examiner*—Peguy JeanPierre

(57) ABSTRACT

A flash analog-to-digital converter comprising a resistive reference ladder, a set of comparators for comparing the analog input signal with the reference voltages of the ladder to provide a digital code representing a coarse quantization of the input signal, a set of switches connected to the reference ladder and controlled by said digital code to provide an analog representation of the coarse quantization of the input signal, means to derive from said analog representation of the coarse quantization and from the input signal one or more residue signals and a fine analog-to-digital converter stage to generate a digital code representing a fine quantization of the one or more residue signals. For minimizing the number of switches required, each selector for one residue signal selects voltages of one half of the ladder at two values of the coarse quantization and the output signals of the two selectors for that residue signal are reversed by a crossover switch when the coarse quantization passes its center value.

10 Claims, 3 Drawing Sheets

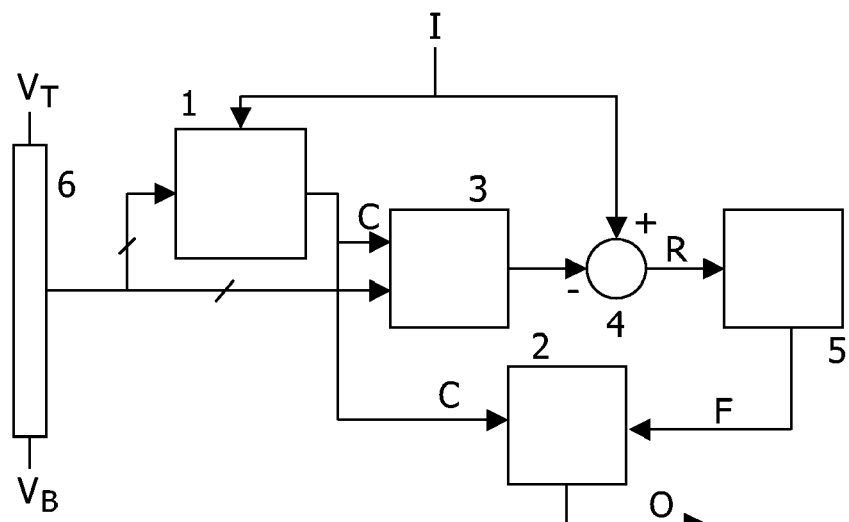

FIG.1

Figure 2A:
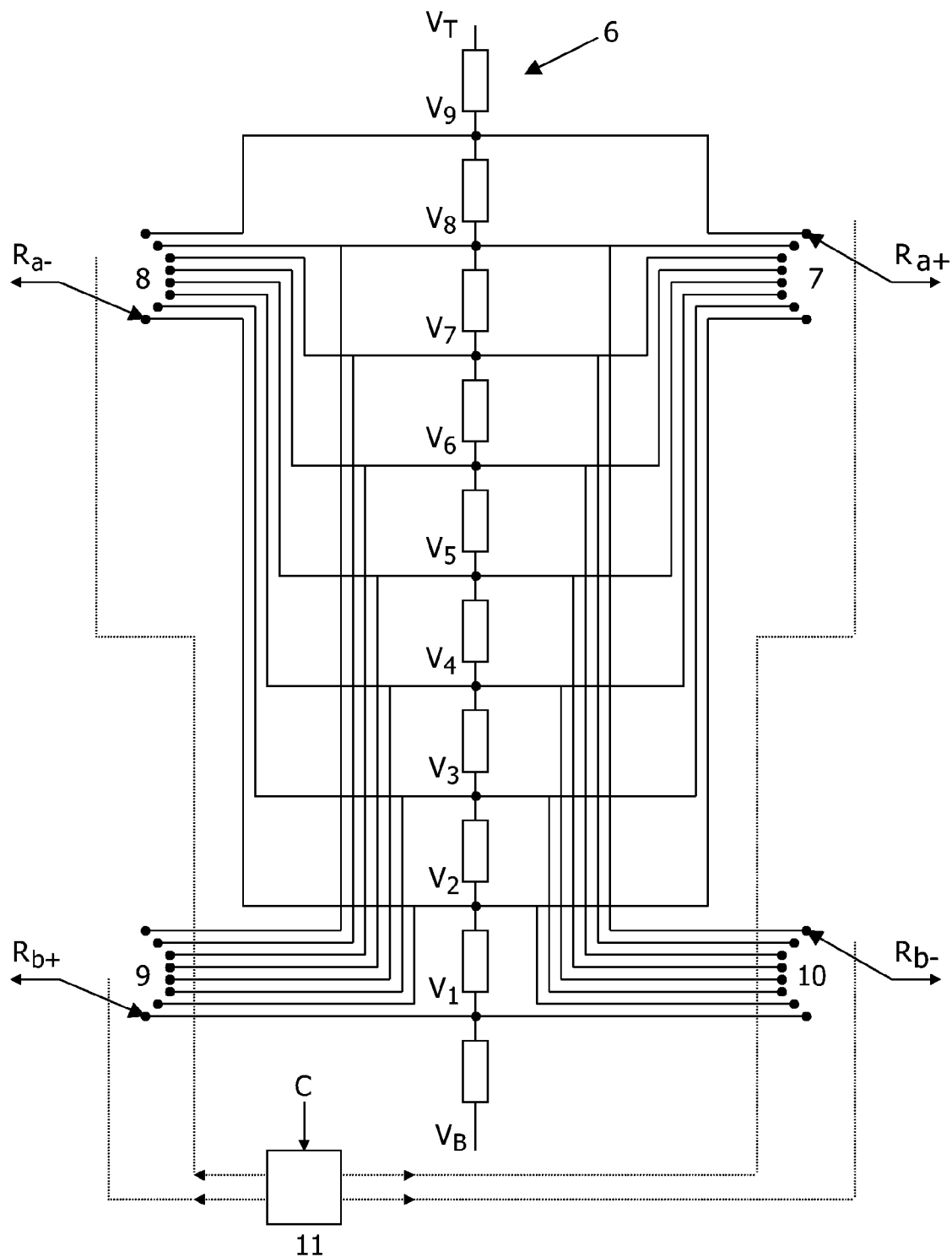

| $R_{b-}$ | $V_8$ | $V_7$ | $V_6$ | $V_5$ | $V_4$ | $V_3$ | $V_2$ | $V_1$ |
|---|---|---|---|---|---|---|---|---|
| $R_{b+}$ | $V_1$ | $V_2$ | $V_3$ | $V_4$ | $V_5$ | $V_6$ | $V_7$ | $V_8$ |
| $R_{a-}$ | $V_2$ | $V_3$ | $V_4$ | $V_5$ | $V_6$ | $V_7$ | $V_8$ | $V_9$ |
| $R_{a+}$ | $V_9$ | $V_8$ | $V_7$ | $V_6$ | $V_5$ | $V_4$ | $V_3$ | $V_2$ |
| | $I \gg$ | | | | | | | |

FIG.2b

| $R_{b-}$ | $V_8$ | $V_7$ | $V_6$ | $V_5$ | $V_4$ | $V_3$ | $V_2$ | $V_1$ |
|---|---|---|---|---|---|---|---|---|
| $R_{b+}$ | $V_1$ | $V_2$ | $V_3$ | $V_4$ | $V_5$ | $V_6$ | $V_7$ | $V_8$ |
| $R_{a-}$ | $V_2$ | $V_3$ | $V_4$ | $V_5$ | $V_6$ | $V_7$ | $V_8$ | $V_9$ |
| $R_{a+}$ | $V_9$ | $V_8$ | $V_7$ | $V_6$ | $V_5$ | $V_4$ | $V_3$ | $V_2$ |
| T | 1 | 1 | 1 | 1 | -1 | -1 | -1 | -1 |
| $Q_4$ | $V_8$ | $V_7$ | $V_6$ | $V_5$ | $V_5$ | $V_6$ | $V_7$ | $V_8$ |
| $Q_3$ | $V_1$ | $V_2$ | $V_3$ | $V_4$ | $V_4$ | $V_3$ | $V_2$ | $V_1$ |
| $Q_2$ | $V_2$ | $V_3$ | $V_4$ | $V_5$ | $V_5$ | $V_4$ | $V_3$ | $V_2$ |
| $Q_1$ | $V_9$ | $V_8$ | $V_7$ | $V_6$ | $V_6$ | $V_7$ | $V_8$ | $V_9$ |
| | $I \gg$ | | | | | | | |

FIG.3b

FLASH A/D CONVERTER

The invention relates to a flash analog-to-digital converter as defined by the preamble of claim 1.

Such a converter is known from the article "A 2.5-V 12-b 54-Msample/s 0.25-μm CMOS ADC in 1-mm² With Mixed-Signal Chopping and Calibration" by van der Ploeg et al in IEEE Journal of Solid State Circuits, Vol. 36 No. 12, December 2001, pp 1859-1867.

A flash analog-to-digital converter contains a resistive reference ladder to generate a plurality of reference voltages. A problem with a single stage flash converter is that for each value of the digital output signal a reference voltage is required, so that for a 12-bit converter a reference ladder with $2^{12}-1=1023$ resistive elements would be necessary. To avoid this and other problems a multi-stage flash converter is developed. A two-stage flash converter uses a coarse and a fine quantization to achieve the required resolution. For instance the coarse quantization generates a 5-bit digital word with a reference ladder of $2^5-1=31$ taps. Subsequently the 5-bit word is converted in a digital-to-analog converter to its analog equivalent, this analog equivalent is subtracted from the analog input signal and the difference, the residue, is applied to the second DA-stage that performs the fine quantization of the residue. This second stage may e.g. generate a 7-bit fine code. In a digital decoder the 5-bit coarse code and the 7-bit fine code are combined to obtain the 12-bit digital output signal. In practice this means that selectors with a large number of switches have to be connected to the reference ladder to perform the digital to analog conversion. This large number of switches and the correspondingly large number of wires to and from the switches makes the layout of the chip more complicated and results in a large parasitic capacitance that is undesired for high-speed conversion.

The present invention seeks to substantially reduce the number of switches in a flash analog-to-digital converter of the abovementioned kind and the analog-to-digital converter of the present invention is therefore characterized by the characterizing portion of claim 1.

In prior art flash single ended, single residue analog-to-digital converters of the abovementioned kind the number of switches connected to the reference ladder is $2^n$ where n is the number of bits generated by the coarse quantization stage. In a dual residue version the number of switches is doubled to $2^{n+1}$ and in a differential version the number of these switches is again doubled to $2^{n+2}$. In a converter according to the invention the doubling for the differential version is avoided and in stead 4 switches per residue are required for performing the crossover function. This implies that with 3 bits coarse quantization in a dual residue differential converter the number of switches for generating the residue signals is reduced from 32 to 24. This does not seem to be a large improvement, however, if the number of bits of the coarse quantization increases to e.g. 5, the number of switches is reduced from 128 to 68 which is a substantial improvement. This means a much smaller capacitive load of the reference ladder, which can be helpful for faster generation of the residue signals and therefore in a higher speed of the analog-to-digital converter. Moreover the dissipation will be lower and the silicon area will be less. Another advantage is the reduction of the number of wires to and from the switches.

Preferably the reference ladder has a double function. First reference voltages for the course flash conversion are generated. After completion of the coarse quantization, the coarse code is stored and the plurality of selectors connected to the taps of the reference ladder and controlled by the stored coarse code generate the analog representation of the coarse code.

Preferably the analog-to-digital converter constituted by the reference ladder and the selectors generate two analog representations of the coarse code so as to allow the generation of two residue signals. Moreover, on a low voltage CMOS chip with a lot of digital processing all the signals in the analog-to-digital converter should preferably be differential signals.

The invention further relates to a digital-to-analog converter for use in a flash analog-to-digital converter as claimed in claim 4 and a method for analog-to-digital conversion as claimed in claim 6.

Figure 3A:
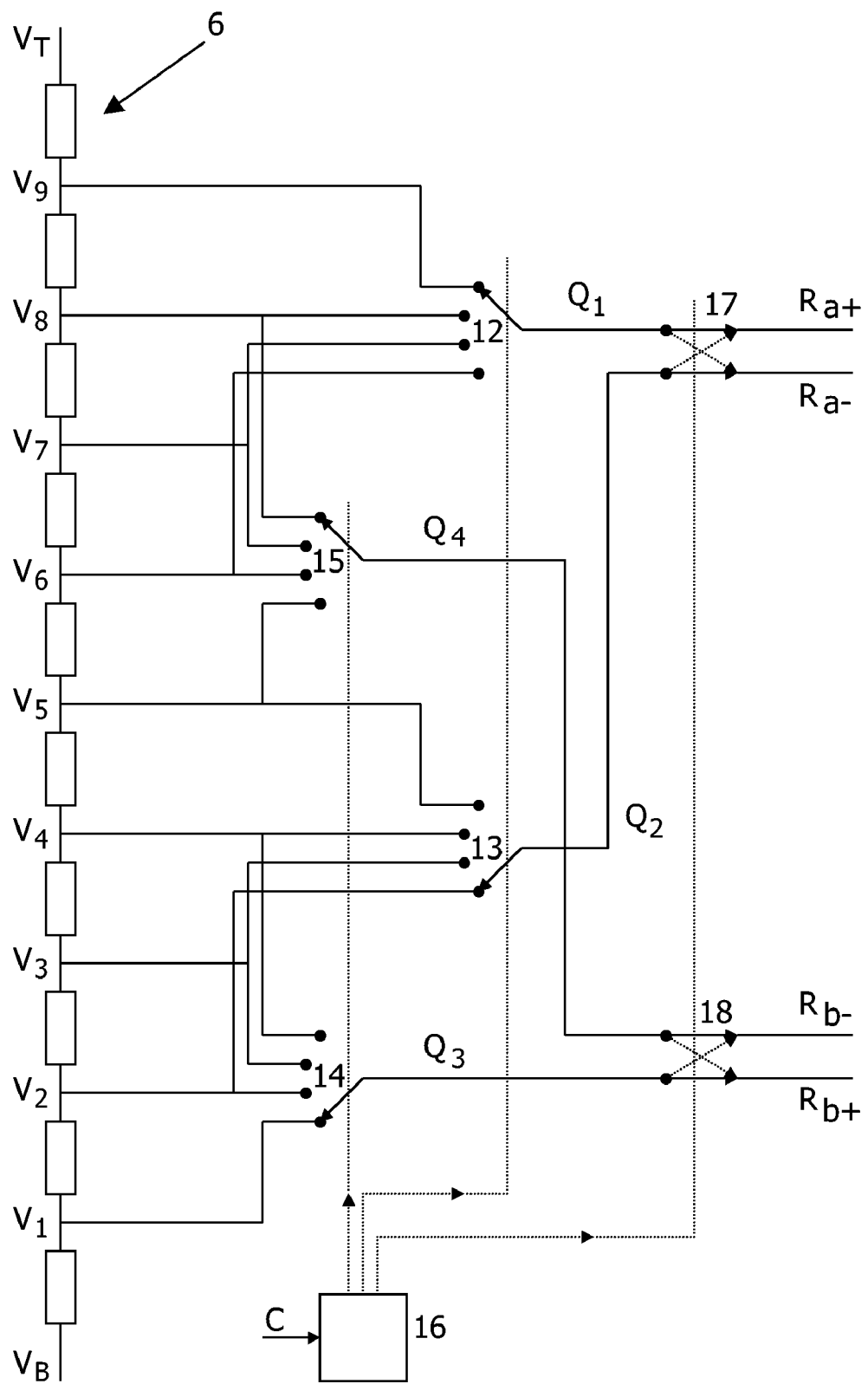

The invention will be described with reference to the accompanying Figures. Herein shows:

FIG. 1 two-stage flash analog-to-digital converter known from the cited article, FIG. 2a the reference ladder and the digital-to-analog converter in the analog-to-digital converter of FIG. 1, FIG. 2b the output signals of the digital-to-analog converter of FIG. 2a, FIG. 3a the reference ladder and the digital-to-analog converter in an analog-to-digital converter of the present invention and FIG. 3b the output signals of the digital-to-analog converter of FIG. 3a.

The analog-to-digital converter of FIG. 1 shows an analog input signal I being applied to a coarse analog-to-digital converter unit 1. Usually the input signal is applied through a sample & hold circuit (not shown). The analog-to-digital converter receives a plurality of reference voltages from a resistive reference ladder 6 whose terminals are connected to DC voltages VT and VB. The coarse analog-to-digital converter unit 1 contains a plurality of comparators for comparing the input signal with the reference voltages of the ladder 6 and the result of these comparisons is fed as coarse quantization code C to a digital decoder 2.

The coarse quantization code C is also applied to a digital-to-analog converter unit 3. This unit receives also the reference voltages of the ladder 6 and contains a plurality of switches that are controlled by the code C. The output signal of the unit 3 is an analog version of the code C and therefore follows the input signal I with coarse quantization. The operation of this digital-to-analog converter 3 will be further explained with reference to the FIGS. 2 and 3. In a subtracter 4 the coarsely quantized analog signal from the digital-to-analog converter 3 is subtracted from the input signal I and the difference signal so obtained (the residue signal R) is the quantization error that is left after the coarse quantization in the unit 1. This residue signal R is digitized in a fine analog-to-digital converter 5 and the fine quantization code F resulting therefrom is applied to a second input of the digital decoder 2. The output-signal O of this decoder constitutes the digital output signal of the arrangement.

The digital-to-analog converter shown in FIG. 2a is intended for use in a dual residue differential analog-to-digital converter with n=3 bit coarse quantization. The digital-to-analog converter makes use of the resistive reference ladder 6 that delivers a plurality of equidistant reference voltages $V_1$-$V_9$. This ladder has a double function: generating the reference voltages for the comparisons with the input signal in the coarse analog-to-digital converter 1 and the creation of the analog version of the digital code C in the digital-to-analog converter 3. The digital-to-analog converter of FIG. 2a comprises four selectors 7, 8, 9 and 10 each having $2^n=8$ positions for connection to 8 reference voltages of the ladder 6. The selectors 7 and 8 are connected to the reference voltages $V_2$ to $V_9$ for generating analog signals $R_{a+}$ and $R_{a-}$ respectively and the selectors 9 and 10 are connected to the reference voltages $V_1$ to $V_8$ for generating analog signals $R_{b+}$ and $R_{b-}$ respectively. The arrangement further comprises a control unit 11 that receives the digital code C from the coarse analog-to-digital converter 1. The selectors 7, 8, 9 and 10 are drawn in the position that they have when the input signal I has its lowest value. Under control of the control unit 11 the four selectors are so operated that with increasing input signal the selector 7 steps from $V_9$ to $V_2$, selector 8 steps from $V_2$ to $V_9$, selector 9 steps from $V_1$ to $V_8$ and selector 10 steps from $V_8$ to $V_1$. FIG. 2b illustrates the operation of the digital-to-analog converter of FIG. 2a. The diagram shows, for the 8 coarse quantization sub-ranges of the input signal I, the values of the four output signals $R_{a+}$, $R_{a-}$, $R_{b+}$ and $R_{b-}$ of the digital-to-analog converter. The two signals $R_{a+}$ and $R_{a-}$ together form the differential coarsely quantized signal for constituting the first residue and the two signals $R_{b+}$ and $R_{b-}$ together form the differential coarsely quantized signal for constituting the second residue. As explained with reference to FIG. 1 the fine converter 5 uses these residue signals to determine the fine bits F.

It may be observed that in practice eight one-pole switches build each of the four selectors 7, 8, 9 and 10. Therefore this arrangement needs a total of 32 one-pole switches for making a 3-bit course quantization ($2^{n+2}=32$ with n=3).

In the arrangement of FIG. 3a the number of switches is substantially reduced. The reference ladder of his arrangement is exactly the same as that of FIG. 2a. With increasing input signal a 4-position selector 12 with output signal $Q_1$ selects in succession the reference voltages $V_9$, $V_8$, $V_7$, $V_6$ and thereafter backwards $V_6$, $V_7$, $V_8$, $V_9$. A 4-position selector 13 with output signal $Q_2$ selects in succession the reference voltages $V_2$, $V_3$, $V_4$, $V_5$ and thereafter $V_5$, $V_4$, $V_3$, $V_2$. Similarly the third selector 14 with output signal $Q_3$ selects in succession the voltages $V_1$, $V_2$, $V_3$, $V_4$, $V_4$, $V_3$, $V_2$, $V_1$ and the fourth selector 15 with output signal $Q_4$ selects in succession the voltages $V_8$, $V_7$, $V_6$, $V_5$, $V_5$, $V_6$, $V_7$, $V_8$. All this is illustrated by the four lower rows of FIG. 3b. A control unit 16 that itself is controlled by the course quantization code C controls the four selector switches.

The signals $Q_1$ and $Q_2$ of the selectors 12 and 13 are fed to a crossover switch 17 to constitute the signals $R_{a+}$ and $R_{a-}$ and the output signals $Q_3$ and $Q_4$ of the selectors 14 and 15 are fed to a crossover switch 18 to constitute the signals $R_{b+}$ and $R_{b-}$. The two crossover switches are switched when the input signal is halfway of its full range.

The result of this action of the crossover switches is depicted in the upper four rows of FIG. 3b. A comparison between the two FIGS. 2b and 3b reveals that in both cases the four output signals $R_{a+}$, $R_{a-}$, $R_{b+}$, $R_{b-}$ are effectively the same. However the number of switches required is substantially reduced in the arrangement of FIG. 3a. Taking into account that in FIG. 3a four single pole switches build each selector switch (for n=3) and that also four single pole switches build each crossover switch (for any value of n), the total number of switches is 24 whereas the total number of switches in the arrangement of FIG. 2a is 32. With higher bit-values for the coarse quantization this difference dramatically increases.

In summary the invention relates to a flash analog-to-digital converter comprising a resistive reference ladder, a set of comparators for comparing the analog input signal with the reference voltages of the ladder to provide a digital code representing a coarse quantization of the input signal, a set of switches connected to the reference ladder and controlled by said digital code to provide an analog representation of the coarse quantization of the input signal, means to derive from said analog representation of the coarse quantization and from the input signal one or more residue signals and a fine analog-to-digital converter stage to generate a digital code representing a fine quantization of the one or more residue signals. For minimizing the number of switches required, each selector for one residue signal selects voltages of one half of the ladder at two values of the coarse quantization and the output signals of the two selectors for that residue signal are reversed by a crossover switch when the coarse quantization passes its center value.

The invention can also be used in a single residue multi-stage flash analog-to-digital converter. Because in that case only one pair of differential signals $R_{a+}$ and $R_{a-}$ is needed the selectors 13 and 14 and the crossover switches 18 can be dispensed with.

It will be apparent that the invention can also be used in a flash analog-to-digital converter having more than two stages. In that case the digital-to-analog converter with its selectors and its crossover switches can be applied in any of the stages except, of course, the last one.

The invention claimed is:

1. A flash analog-to-digital converter for converting an analog input signal to a digital output signal, said converter comprising
    a cascade of at least two converter stages, the first of said stages comprising means to receive the analog input signal,
    a resistive reference ladder providing a range of reference voltages,
    means to compare the input signal with said plurality of reference voltages and deriving therefrom a digital code representing a course quantization of the analog input signal,
    a digital-to-analog converter stage comprising a plurality of selectors controlled by said digital code and selecting from the plurality of reference voltages an analog representation of said course quantization,
    means to subtract said analog representation from the analog input signal to obtain a residue signal, characterized in that at each sample of the digital code one selector of a pair of selectors selects a first reference voltage from one half of the range of reference voltages while the other selector selects a second reference voltage from the other half of the range of reference voltages, such that the first and second reference voltages lie symmetrically with respect to the center of the range of reference voltages and that the output signals of said pair of selectors are transferred through a cross-over switch that is arranged to switch at the center of the range of the coarse quantization.

2. An analog-to-digital converter as claimed in claim 1, characterized in that the reference ladder is arranged to provide a plurality of equidistant reference voltages.

3. An analog-to-digital converter as claimed in claim 1, characterized by further comprising means to supply said residue signal to a second converter stage to generate a fine quantization of the analog input signal.

4. A digital-to-analog converter for use in a flash analog-to-digital converter comprising
    a resistive reference ladder providing a range of reference voltages,
    a plurality of selectors controlled by a digital code and selecting from the plurality of reference voltages an analog representation, characterized in that at each sample of the digital code one selector of a pair of selectors selects a first reference voltage from half of the range of reference voltages while the other selector selects a second reference voltage from the other half of the range of reference voltages such that the first and second reference voltages lie symmetrically with respect to the center of the range of reference voltages and that output signals of said pair of selectors are transferred through a cross-over switch that is arranged to switch at the center of the range of reference voltages.

5. A digital-to-analog converter as claimed in claim 1, characterized in that the reference ladder is arranged to provide a range of equidistant reference voltages.

6. A method for converting an analog input signal to a digital output signal, comprising:
deriving a digital code representing a course quantization of the input signal, a step of deriving an analog representation from said digital code,
obtaining a residue signals by subtracting said analog representation from the analog input signal, characterized in that said analog representation is obtained by a digital-to-analog converter comprising a resistive reference ladder providing a range of reference voltages, whereby a first reference voltage is selected from one half of the range of reference voltages and a second reference voltage is selected from the other half of the range reference voltages whereby the first and second reference voltages are selected at two values of the coarse quantization that lie symmetrically with respect to the center of the full range of the coarse quantization.

7. A method as claimed in claim 6, characterized in that the first and second reference voltages are transferred to obtain the analog representation through a cross-over switch that switches at the center of the full range of the coarse quantization.

8. A method as claimed in claim 6, characterized in that the residue signal is supplied to a second stage of the analog-to-digital converter to generate a fine quantization of the analog input signal.

9. A method as claimed in claim 6, characterized in that the plurality of reference voltages provided by the reference ladder is a plurality of equidistant reference voltages.

10. A method as claimed in claim 6 wherein said residue signal is supplied to a second converter stage to generate a fine quantization of the analog input signal.

* * * * *